(12) United States Patent
Wang et al.

(10) Patent No.: US 10,811,545 B2
(45) Date of Patent: Oct. 20, 2020

(54) SENSING MODULE AND IMAGE CAPTURING APPARATUS

(71) Applicant: Gingy Technology Inc., Hsinchu (TW)

(72) Inventors: Chiung-Han Wang, Hsinchu (TW);
Wen-Chen Lee, Hsinchu (TW);
Po-Chun Lin, Hsinchu (TW);
Jen-Chieh Wu, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 0 days.

(21) Appl. No.: 16/510,965

(22) Filed: Jul. 14, 2019

(65) Prior Publication Data
US 2020/0266227 A1 Aug. 20, 2020

(30) Foreign Application Priority Data

Feb. 14, 2019 (TW) .............................. 108104980 A
Apr. 24, 2019 (TW) .............................. 108114300 A

(51) Int. Cl.
*H01L 31/0216* (2014.01)
*H01L 27/146* (2006.01)
(Continued)

(52) U.S. Cl.
CPC .... *H01L 31/02164* (2013.01); *G06K 9/00013* (2013.01); *H01L 27/14623* (2013.01);
(Continued)

(58) Field of Classification Search
CPC . H01L 31/00; H01L 31/0203; H01L 31/0216; H01L 31/02161; H01L 31/02162; H01L 31/02164; H01L 31/101; H01L 31/102; H01L 31/103; H01L 31/109; H01L 31/105; G02B 5/18; G02B 5/1804;
(Continued)

(56) References Cited

U.S. PATENT DOCUMENTS 9,245,164 B2 1/2016 Pan et al.
10,091,402 B1 10/2018 Chung et al.
(Continued)

FOREIGN PATENT DOCUMENTS

CN 103019474 4/2013
CN 105279505 1/2016
(Continued)

*Primary Examiner* — Eduardo A Rodela
(74) *Attorney, Agent, or Firm* — JCIPRNET

(57) ABSTRACT

A sensing module including a sensing array, a first shielding layer, a second shielding layer, and a reflective layer is provided. The sensing array includes a plurality of light passing regions and a light receiving surface facing away from an object, and the sensing array is located between the first shielding layer having a plurality of first openings and the second shielding layer having a plurality of second openings. The second shielding layer is located between the sensing array and the reflective layer. The light beams reflected by the object sequentially pass through the first openings, the light passing regions, the second openings, and are then transmitted to the reflective layer. The light beams are reflected by the reflective layer and then pass through the second openings again to be transmitted to the light receiving surface of the sensing array. An image capturing apparatus is also provided.

20 Claims, 3 Drawing Sheets

(51) Int. Cl.
  *G06K 9/00* (2006.01)
  *H01L 31/0203* (2014.01)
  *H01L 31/105* (2006.01)
  *H01L 31/101* (2006.01)
  *H01L 31/109* (2006.01)
  *H01L 31/102* (2006.01)
  *H01L 31/103* (2006.01)

(52) U.S. Cl.
  CPC .... *H01L 27/14627* (2013.01); *H01L 31/0203* (2013.01); *H01L 31/0216* (2013.01); *H01L 31/02161* (2013.01); *H01L 31/02162* (2013.01); *H01L 31/101* (2013.01); *H01L 31/102* (2013.01); *H01L 31/103* (2013.01); *H01L 31/105* (2013.01); *H01L 31/109* (2013.01); *G06K 2009/0006* (2013.01)

(58) Field of Classification Search
  CPC .. G02B 5/1814; G02B 5/1819; G02B 5/1861; G02B 5/1866; G06K 19/0718
  See application file for complete search history.

(56) References Cited

U.S. PATENT DOCUMENTS

| | | | |
|---|---|---|---|
| 2007/0290284 A1* | 12/2007 | Shaffer | H01L 31/02164 257/432 |
| 2013/0119237 A1* | 5/2013 | Raguin | H01L 27/14601 250/208.1 |
| 2014/0138784 A1* | 5/2014 | Dyer | H01L 27/14629 257/432 |
| 2014/0218327 A1 | 8/2014 | Shi et al. | |
| 2016/0140380 A1 | 5/2016 | Carver et al. | |
| 2016/0234816 A1 | 8/2016 | Nakao et al. | |
| 2018/0019288 A1* | 1/2018 | Yang | G06F 3/0412 |
| 2018/0293452 A1 | 10/2018 | Chung et al. | |

FOREIGN PATENT DOCUMENTS

| | | |
|---|---|---|
| TW | I545335 | 8/2016 |
| TW | I644263 | 12/2018 |

* cited by examiner

SENSING MODULE AND IMAGE CAPTURING APPARATUS

CROSS-REFERENCE TO RELATED APPLICATION

This application claims the priority benefits of Taiwan application serial no. 108104980, filed on Feb. 14, 2019, and Taiwan application serial no. 108114300, filed on Apr. 24, 2019. The entirety of each of the above-mentioned patent applications is hereby incorporated by reference herein and made a part of this specification.

BACKGROUND

Technical Field

The disclosure relates to a photoelectric module and a photoelectric apparatus adopting the photoelectric module, and specifically relates to a sensing module and an image capturing apparatus adopting the sensing module.

Description of Related Art

Biological identification includes face, sound, iris, retina, vein, palm print and fingerprint identifications, etc. According to the different sensing methods, the biological identification apparatus can be categorized into optical, capacitive, ultrasonic and thermal sensing devices. In general, an optical biological identification apparatus includes a light source, a light guiding element, and a sensor. The light beams emitted by the light source illuminate the object pressing on the light guiding element, and the sensor receives the light beams reflected by the object, so as to perform biological identification.

Take fingerprint identification as an example, when a finger is pressed on the light guiding element, the ridges of the fingerprint contacts the light guiding element, and the valleys of the fingerprint do not contact the light guiding element. Therefore, the ridges of the fingerprint destroy the total internal reflection of the light beams in the light guiding element, so that the sensor obtains the dark lines corresponding to the ridges. Simultaneously, the valleys of the fingerprint do not destroy the total internal reflection of the light beams in the light guiding element, so that the sensor obtains the bright lines corresponding to the valleys. Therefore, the light beams corresponding to the ridges and the valleys of the fingerprint form a bright and dark stripe pattern on the light receiving surface of the sensor. The data corresponding to the fingerprint image is calculated using algorithm, so as to identify a user identity.

In the process of capturing image of the sensor, the light beams reflected by the fingerprint are possibly transmitted to the sensor in a scattered manner, thereby resulting in crosstalk. Crosstalk reduces the contrast between the dark-line areas and the bright-line areas of the fingerprint pattern, thereby resulting in poor image quality and affecting identification accuracy. Although there have been techniques to improve the image quality, it is still difficult to effectively improve the crosstalk problem at the current stage.

SUMMARY

The disclosure provides a sensing module and an image capturing apparatus having a good identification capability.

A sensing module of the disclosure includes a sensing array, a first shielding layer, a second shielding layer, and a reflective layer. The sensing array has a plurality of light passing regions and a light receiving surface facing away from an object. The first shielding layer is located between the sensing array and the object and has a plurality of first openings. The second shielding layer has a plurality of second openings, and the second shielding layer and the first shielding layer are respectively located on two opposite sides of the sensing array. The reflective layer and the sensing array are respectively located on two opposite sides of the second shielding layer. The first openings allow light beams reflected from the object to pass through. The light passing regions allow the light beams passing through the first openings to pass through. The second openings allow the light beams passing through the light passing regions to pass through and then the light beams are transmitted to the reflective layer. The reflective layer reflects the light beams so that the light beams pass through the second openings again to be transmitted to the light receiving surface of the sensing array.

An image capturing apparatus of the disclosure includes a display panel and a sensing module. The sensing module located on one side of the display panel includes a sensing array, a first shielding layer, a second shielding layer, and a reflective layer. The sensing array has a plurality of light passing regions and a light receiving surface facing away from an object. The first shielding layer is located between the sensing array and the object and has a plurality of first openings. The second shielding layer has a plurality of second openings, and the second shielding layer and the first shielding layer are respectively located on two opposite sides of the sensing array. The reflective layer and the sensing array are respectively located on two opposite sides of the second shielding layer. The first openings allow light beams reflected from the object to pass through. The light passing regions allow the light beams passing through the first openings to pass through. The second openings allow the light beams passing through the light passing regions to pass through and then the light beams are transmitted to the reflective layer. The reflective layer reflects the light beams so that the light beams pass through the second openings again to be transmitted to the light receiving surface of the sensing array.

Based on the above, in the exemplary embodiments of the disclosure, scattered light beams are shielded (absorbed) by a plurality of shielding layers, and light beams reflected by the object are transmitted to the light receiving surface facing away from the object of the sensing array through a plurality of openings of the shielding layers and the reflective layer. Therefore, the sensing module can effectively improve the crosstalk problem, and the sensing module and the image capturing apparatus adopting the sensing module have a good identification capability.

In order to make the aforementioned and other features and advantages of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
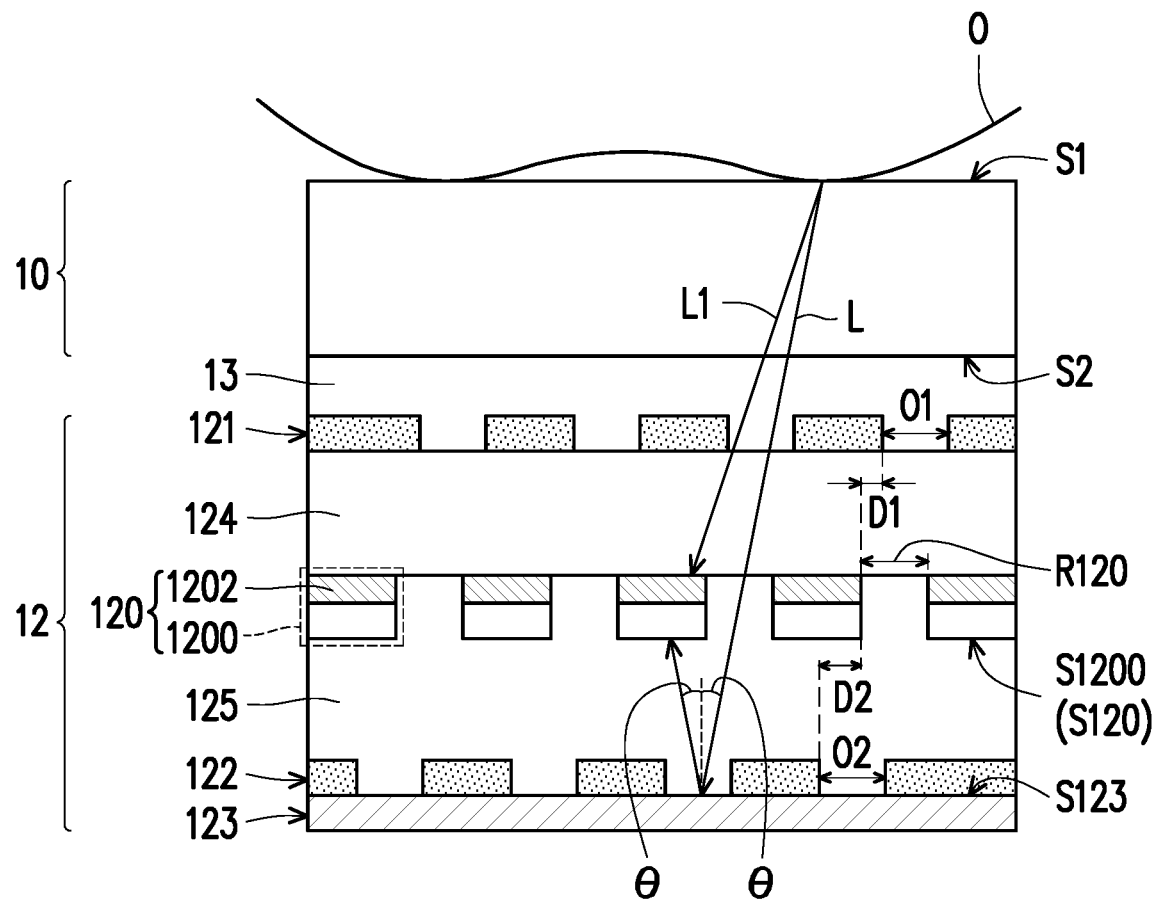
FIGS. 1 to 3 are respectively partial cross-sectional views of image capturing apparatuses according to the first exemplary embodiment to the third exemplary embodiment of the disclosure.

The directional terminologies mentioned in the detailed description, such as "top", "bottom", "front", "back", "left", or "right", etc., are used with reference to the orientation of the FIG(s) being described. Accordingly, the drawings and descriptions will be regarded as illustrative in nature and not as restrictive. In the drawings, the figures show typical features of the methods, structures, and/or materials used in the particular exemplary embodiments. However, the drawings are not to be interpreted as limiting or limiting the scope or nature of the exemplary embodiments disclosed. For example, for clarity, the relative size, thickness and location of the various layers, regions and/or structures may be reduced or magnified.

In the exemplary embodiments, the same or similar elements will be given the same or similar reference numerals and their description will be omitted. In addition, the features in the different exemplary embodiments can be combined with each other as long as there is no conflict, and equivalent changes and modifications made in the specification or claims are still within the scope of this disclosure. Moreover, "first", "second", etc. mentioned in the specification and the claims are merely used to name the discrete elements or to differentiate different ranges or embodiments and therefore should not be regarded as limiting the upper or lower bound of the number of the components/devices and should not be used to limit the manufacturing sequence of components.

Figure 2:
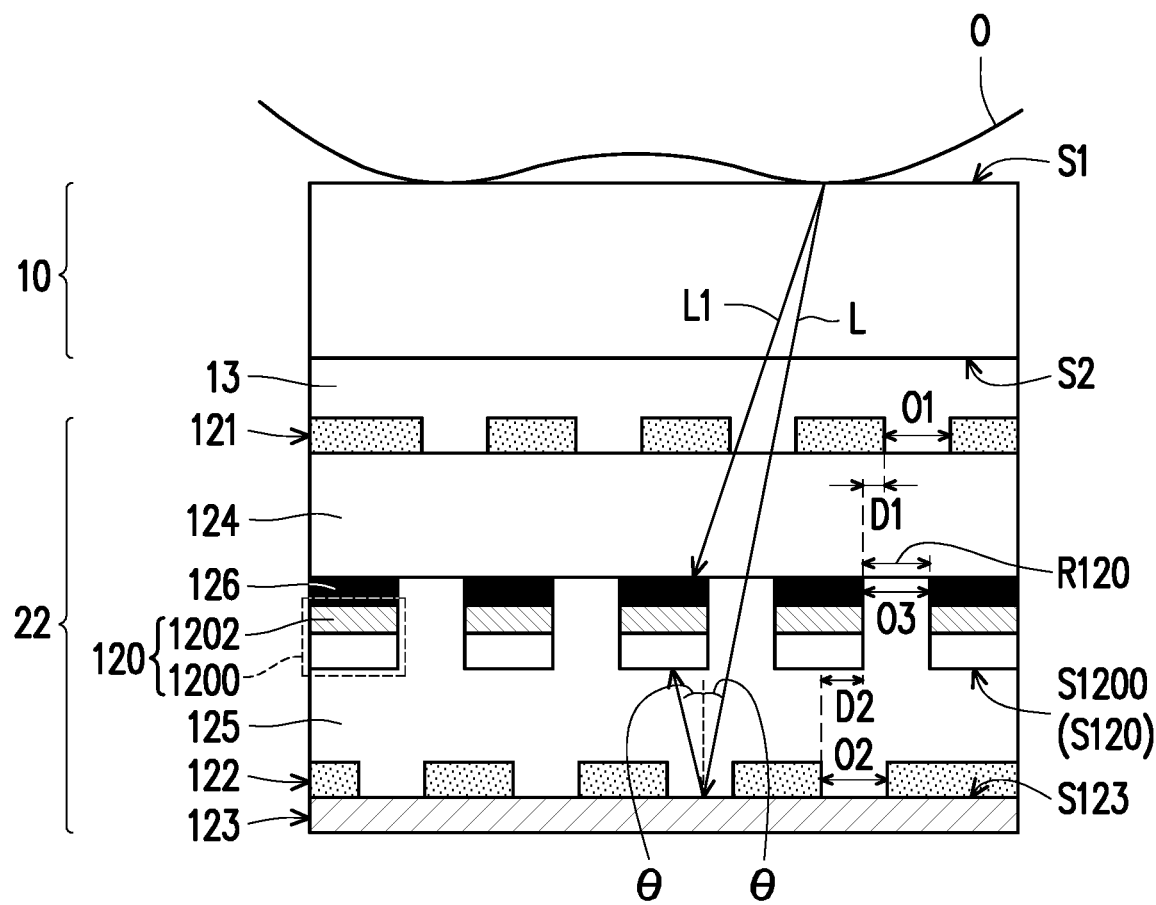
Figure 3:
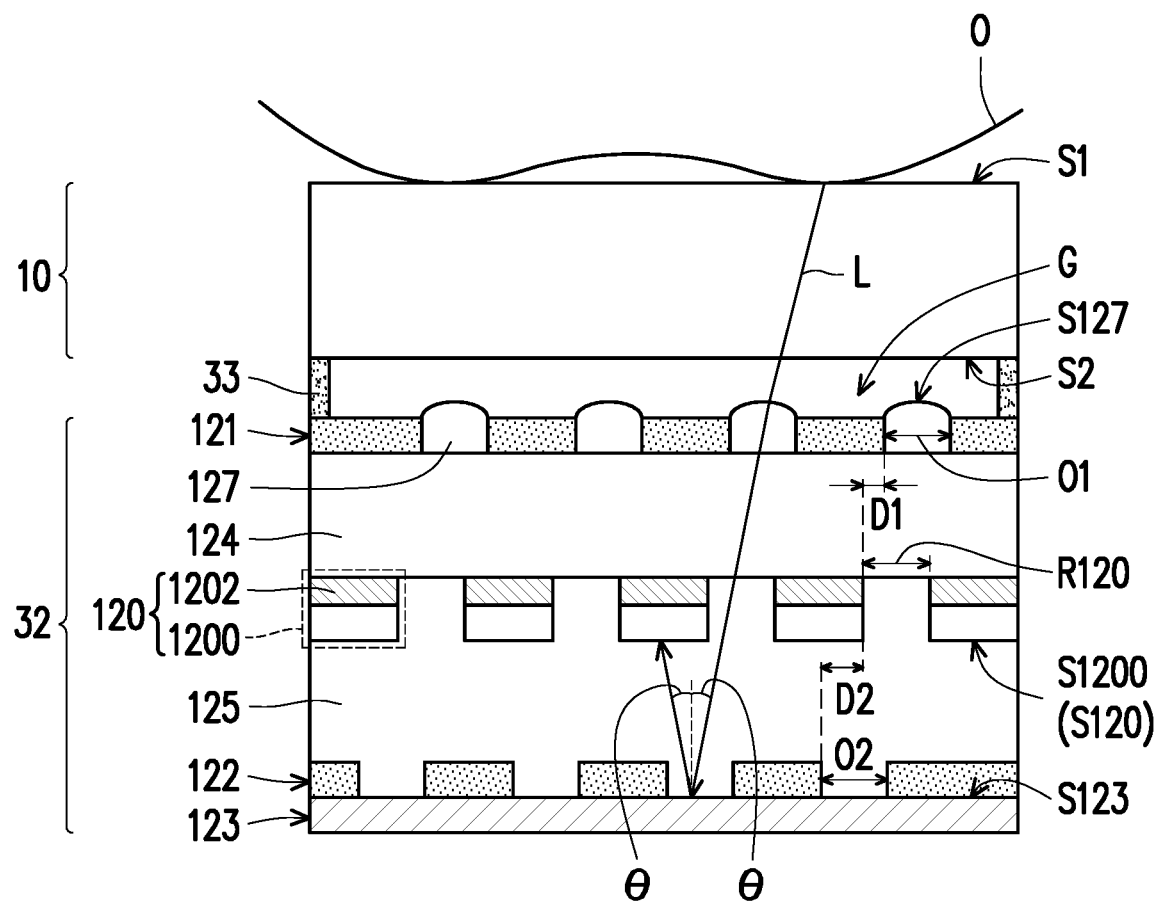

FIGS. 1 to 3 are respectively partial cross-sectional views of image capturing apparatuses 1 to 3 according to the first exemplary embodiment to the third exemplary embodiment of the disclosure. In the embodiments of the disclosure, the image capturing apparatuses 1 to 3 are suitable to capture biological features of an object O. For example, the object O may be a finger, a palm, a wrist or an eyeball of a user, and the corresponding biological features may be fingerprints, palm prints, veins, pupils or irises, etc., but the disclosure is not limited thereto.

Referring to FIG. 1, the image capturing apparatus 1 of the first exemplary embodiment includes a display panel 10 and a sensing module 12. The display panel 10 has a display surface S1 and a bottom surface S2 opposite to the display surface S1. The display panel 10 emits image light beams (not shown) through the display surface S1 so that the user can view the displayed image. In the exemplary embodiment, the display surface S1 of the display panel 10 is also a biological identification surface. In other words, the object O touches the display surface S1 in order to perform biological identification.

The display panel 10 may be a thin film transistor liquid crystal display panel (TFT-LCD panel), a micro light emitting diode display panel (Micro LED display panel), or an organic light emitting diode display panel (OLED display panel), but the disclosure is not limited thereto. Moreover, the display panel 10 may also be a display panel with touch electrodes.

A part of the image light beams (such as visible light) provided by the display panel 10 may be used for biological identification, but the disclosure is not limited thereto. In another exemplary embodiment, the image capturing apparatus 1 may further include a light source (not shown) which provides light beams for biological identification. The wavelength of the light beam provided by the light source may be different from the wavelength of the image light beam (wavelength of visible light). For example, the light source may be a non-visible light source, such as an infrared light source, but the disclosure is not limited thereto. In addition, the light source may be disposed outside the display panel 10 or integrated into the display panel 10.

The sensing module 12 is disposed on a side of the display panel 10. For example, the sensing module 12 can be fixed on the bottom surface S2 of the display panel 10 through an adhesive layer or a fixing mechanism (not shown).

The sensing module 12 includes a sensing array 120, a first shielding layer 121, a second shielding layer 122, and a reflective layer 123. The sensing array 120 is adapted to receive a light beam L (for example, the light carrying biological features) reflected by the object O in order to perform biological identification. The sensing array 120 has a plurality of light passing regions R120 and a light receiving surface S120 facing away from the object O. Specifically, the sensing array 120 includes a plurality of sensing elements 1200 arranged in an array. Each of the sensing elements 1200 includes a light receiving surface S1200. The light receiving surface S120 of the sensing array 120 is an assembly of a plurality of light receiving surfaces S1200 of the sensing elements 1200. In addition, each of the sensing elements 1200 further includes a metal layer 1202. The metal layer 1202 is a metal electrode of the sensing element 1200. The light receiving surface S1200 of the sensing element 1200 is located between the metal layer 1202 and the reflective layer 123. In other words, the light receiving surface S1200 of the sensing element 1200 faces the reflective layer 123 and faces away from the object O, so that the light receiving surface S120 of the sensing array 120 faces away from the object O.

Since the metal layer 1202 is opaque, the metal layer 1202 of each sensing element 1200 can prevent the light beam (such as a light beam L1), which is directly transmitted from the object O to the sensing element 1200, from being received by the light receiving surface S1200. That is to say, the region where the metal layer 1202 of each sensing element 1200 is located is the light shielding region of the sensing array 120, and the region between two metal layers 1202 of two adjacent sensing elements 1200 is the light passing region R120. In other words, the light beam is able to pass between two adjacent sensing elements 1200, and the size of the light passing region R120 of the sensing array 120 is determined by the distance between the metal layers 1202 of the two adjacent sensing elements 1200.

The first shielding layer 121 is located between the sensing array 120 and the object O and has a plurality of first openings O1 which allow the light beams to pass through. The first shielding layer 121 is configured for shielding or absorbing the scattered light beams. For example, the first shielding layer 121 has a high absorptance and a low reflectance, so that the proportion of the light beam reflected by the first shielding layer 121 to the light beam transmitted to the first shielding layer 121 is reduced and the number of times that the light beam is reflected by the first shielding layer 121 is also reduced, so as to effectively reduce the proportion of the noise or crosstalk light beams received by the light receiving surface S120. The material of the first shielding layer 121 may be low reflectance ink, photoresist, or carbon compound, but the disclosure is not limited thereto.

The second shielding layer 122 has a plurality of second openings O2, and the second shielding layer 122 and the first shielding layer 121 are respectively located on two opposite sides of the sensing array 120. The second shielding layer 122 is configured for shielding or absorbing the scattered light beams. For example, the second shielding layer 122 has a high absorptance and a low reflectance, so that the proportion of the light beam reflected by the second shielding layer 122 to the light beam transmitted to the second shielding layer 122 is reduced and the number of times that the light beam is reflected by the second shielding layer 122 is also reduced, so as to effectively reduce the proportion of the noise or crosstalk light beams received by the light receiving surface S120. The material of the second shielding layer 122 may be low reflectance ink, photoresist, or carbon compound, but the disclosure is not limited thereto.

The reflective layer 123 and the sensing array 120 are respectively located on two opposite sides of the second shielding layer 122. For example, the second shielding layer 122 may be disposed on a surface S123, which faces the sensing array 120, of the reflective layer 123. The reflective layer 123 is configured to reflect the light beams carrying the biological feature to the light receiving surface S120. For example, the reflective layer 123 may be a single metal layer or a stacked metal layer made of materials selected from aluminum, silver, copper, nickel, zinc and chromium, but the disclosure is not limited thereto. In an exemplary embodiment, the reflective layer 123 may be constituted of a carrier board (not shown) and a metal layer disposed on the carrier board (not shown). The carrier board may be flexible or rigid printed circuit board, and the metal layer may be a patterned or unpatterned metal layer.

The first openings O1 of the first shielding layer 121 allow the light beams L reflected from the object O to pass through. The light passing regions R120 of the sensing array 120 allow the light beams L passing through the first openings O1 to pass through. The second openings O2 of the second shielding layer 122 allow the light beams L passing through the light passing regions R120 to pass through and then the light beams L are transmitted to the reflective layer 123. The reflective layer 123 reflects the light beams L so that the light beams L pass through the second openings O2 again to be transmitted to the light receiving surface S120 of the sensing array 120. In the exemplary embodiment, the plurality of first openings O1, the plurality of second openings O2, and the plurality of light passing regions R120 are arranged to misalign with each other, so that the light beams L reflected by the object O are transmitted to the reflective layer 123 at a specific incident angle (such as an angle θ) and are reflected by the reflective layer 123 at a reflection angle (such as the angle θ), which is equal to the specific incident angle, and then the light beams L are transmitted to the light receiving surface S120 of the sensing array 120. The specific incident angle (such as the angle θ) is greater than 0 degrees and is smaller than 90 degrees. In other words, the light beams L reflected from the object O are not normally incident on the light receiving surface S120 of the sensing array 120. The light beams L reflected from the object O are obliquely transmitted to the reflective layer 123 and is reflected by the reflective layer 123 to be transmitted to the light receiving surface S120 of the sensing array 120. In this design, in order to be received by the light receiving surface S120 of the sensing array 120, the light beams L mainly pass through the first openings O1, the light passing regions R120, and the second openings O2 in sequence to be transmitted to the reflective layer 123 at the specific incident angle, and is reflected by the reflective layer 123 at the reflection angle, which is equal to the specific incident angle, and then pass through the second openings O2 again to be transmitted to the light receiving surface S120 of the sensing array 120.

The above-mentioned phrase "arranged to misalign" indicates that the first openings O1, the second openings O2, and the light passing regions R120 are not aligned with each other. For example, the first opening O1, the second opening O2, and the light passing region R120 may have the same width. A shift D1 of the light passing region R120 relative to the first opening O1 is smaller than the width of the first opening O1, and a shift D2 of the second opening O2 relative to the light passing region R120 is smaller than the width of the light passing region R120. In an exemplary embodiment, the first opening O1, the second opening O2, and the light passing region R120 may have different widths. In addition, the shift D1 and the shift D2 may not be the same.

According to different requirements, the sensing module 12 may further include other components and/or film layers. For example, the sensing module 12 may further include a substrate 124 and an adhesive layer 125. The substrate 124 is disposed between the first shielding layer 121 and the sensing array 120, and the adhesive layer 125 is disposed between the sensing array 120 and the second shielding layer 122.

Specifically, two opposite surfaces of the substrate 124 can be configured to carry the first shielding layer 121 and the sensing array 120, respectively. The substrate 124 may be made of transparent material allowing the light beams to pass through. For example, the substrate 124 may be a transparent glass substrate, a transparent plastic substrate, or a transparent ceramic substrate, etc. The glass substrate may be a chemically strengthened or physically strengthened glass substrate and may also be an unreinforced glass substrate. The plastic substrate may be made of polycarbonate (PC), polyethylene terephthalate (PET), polymethylmethacrylate (PMMA), or polyimide (PI), etc., but the disclosure is not limited thereto.

The adhesive layer 125 is used to adhere the reflective layer 123 disposed with the second shielding layer 122 to the substrate 124 disposed with the sensing array 120. The adhesive layer 125 may be formed by curing transparent material, in order to allow the light beam to pass through. For example, the material of the adhesive layer 125 may be optically clear adhesive (OCA), liquid optical clear adhesive (LOCA), or die attach film (DAF), but the disclosure is not limited thereto.

In another exemplary embodiment, the sensing module 12 may further include more substrates, more adhesive layers, or other components, and will not be described herein.

According to different requirements, the image capturing apparatus 1 may further include other components and/or film layers. For example, the image capturing apparatus 1 may further include an adhesive layer 13 or a fixing mechanism (not shown), so as to fix the display panel 10 and the sensing module 12 to each other. When the adhesive layer 13 is adopted to fix the display panel 10 and the sensing module 12 to each other, the display panel 10 and the sensing module 12 may be fully or partially attached to each other (for example, the peripherals are attached and the centers are not attached). The material of the adhesive layer 13 may be optically clear adhesive (OCA), liquid optical clear adhesive (LOCA), or die attach film (DAF), but the disclosure is not limited thereto.

Referring to FIG. 2, the main differences between an image capturing apparatus 2 of the second exemplary embodiment and the image capturing apparatus 1 in FIG. 1 are described as follows. In the image capturing apparatus 2, a sensing module 22 further includes a third shielding layer 126. The third shielding layer 126 is located between the first shielding layer 121 and the metal layer 1202, and the third shielding layer 126 has a plurality of third openings O3 overlapped with the light passing regions R120. The light passing regions R120 and the third openings O3 are arranged in one-to-one correspondence relationship, and each of the third openings O3 and the corresponding light passing region R120 are at least partially overlapped. As shown in FIG. 2, each of the third openings O3 and the corresponding light passing region R120 have the same width and are fully overlapped, but the disclosure is not limited thereto.

The third shielding layer 126 is configured for shielding or absorbing the scattered light beams. For example, the third shielding layer 126 has a high absorptance and a low reflectance, so that the proportion of the light beam (such as the light beam L1) reflected by the third shielding layer 126 to the light beam transmitted to the third shielding layer 126 is reduced and the number of times that the light beam is reflected by the third shielding layer 126 is also reduced, so as to effectively reduce the proportion of the noise or crosstalk light beams received by the light receiving surface S120. The material of the third shielding layer 126 may be low reflectance ink, photoresist, or carbon compound, but the disclosure is not limited thereto.

Referring to FIG. 3, the main differences between an image capturing apparatus 3 of the third exemplary embodiment and the image capturing apparatus 1 in FIG. 1 are described as follows. In the image capturing apparatus 3, a sensing module 32 further includes a plurality of microlenses 127. The microlenses 127 are respectively disposed inside the first openings O1.

The microlenses 127 and the first openings O1 are arranged in one-to-one correspondence relationship, but the disclosure is not limited thereto. Each of the microlenses 127 is adapted to collimate the light beams L which are transmitted towards the reflective layer 123. For example, a surface S127, which faces the display panel 10, of each of the microlenses 127 is a convex surface, and the convex surface may be spherical or aspheric surface, but the disclosure is not limited thereto. In addition, an adhesive layer 33 located between the display panel 10 and the first shielding layer 121 may partially adhere the display panel 10 and the first shielding layer 121 (for example, the peripheries are adhered), so that an air gap G is located between the microlenses 127 and the display panel 10.

In any exemplary embodiment of the disclosure, the sensing module may further include a bandpass filter layer (not shown). The bandpass filter layer may be disposed between the display panel 10 and the substrate 124 or be disposed between the substrate 124 and the reflective layer 123 to filter light beams which are not used for biological identification, in order to prevent the environmental light beam or the light beam from other light sources from reaching the sensing elements 1200, thereby further improving the identification capability of the image capturing apparatus. For example, the bandpass filter layer may be an infrared bandpass filter layer, which allows the light beams having a wavelength of 800 nm to 900 nm to pass through and filters the light beams having a wavelength outside of 800 nm to 900 nm. Accordingly, the sensing module may further include an infrared light source having a wavelength within the range of 800 nm to 900 nm. In other exemplary embodiments, the bandpass filter layer may be a bandpass filter layer which allows the light beams having a wavelength of 840 nm to 860 nm or 890 nm to 990 nm to pass through, and the sensing module may further include an infrared light source having a wavelength within the range of 840 nm to 860 nm or 890 nm to 990 nm, but the disclosure is not limited thereto.

Based on the above, in the exemplary embodiments of the disclosure, the scattered light beams are shielded (absorbed) by a plurality of shielding layers, and the light beams reflected by the object are transmitted to the light receiving surface facing away from the object of the sensing array through a plurality of openings of the shielding layers and the reflective layer. Therefore, the sensing module can effectively improve the crosstalk problem, and the sensing module and the image capturing apparatus adopting the sensing module have a good identification capability. In one exemplary embodiment, a shielding layer may be disposed on the metal layer of each of the sensing elements of the sensing array, so as to further reduce crosstalk. In another exemplary embodiment, the sensing module may further include a plurality of microlenses respectively disposed in the first openings, so as to collimate the light beams.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A sensing module, comprising:
   a sensing array, having a plurality of light passing regions and a light receiving surface facing away from an object;
   a first shielding layer, located between the sensing array and the object and having a plurality of first openings;
   a second shielding layer, having a plurality of second openings, wherein the second shielding layer and the first shielding layer are respectively located on two opposite sides of the sensing array; and
   a reflective layer, wherein the reflective layer and the sensing array are respectively located on two opposite sides of the second shielding layer, the first openings allow a plurality of light beams reflected by the object to pass through, the light passing regions allow the light beams passing through the first openings to pass through, the second openings allow the light beams passing through the light passing regions to pass through and to be transmitted to the reflective layer, the reflective layer reflects the light beams so that the light beams pass through the second openings again to be transmitted to the light receiving surface of the sensing array.

2. The sensing module as recited in claim 1, wherein the sensing array includes a plurality of sensing elements, each of the sensing elements includes a light receiving surface and a metal layer, and the light receiving surface of the sensing element is located between the metal layer and the reflective layer.

3. The sensing module as recited in claim 2, further comprising:
   a third shielding layer, wherein the third shielding layer is located between the first shielding layer and the metal layer, and the third shielding layer has a plurality of third openings overlapped with the light passing regions.

4. The sensing module as recited in claim 1, further comprising:

a substrate, disposed between the first shielding layer and the sensing array; and an adhesive layer, disposed between the sensing array and the second shielding layer.

5. The sensing module as recited in claim 4, further comprising:

a bandpass filter layer, located between a display panel and the substrate.

6. The sensing module as recited in claim 4, further comprising:

a bandpass filter layer, located between the substrate and the reflective layer.

7. The sensing module as recited in claim 1, wherein the first openings, the second openings, and the light passing regions are arranged to misalign with each other.

8. The sensing module as recited in claim 7, further comprising:

a plurality of microlenses, respectively disposed in the first openings.

9. The sensing module as recited in claim 1, further comprising:

a plurality of microlenses, respectively disposed in the first openings.

10. An image capturing apparatus, comprising:

a display panel; and a sensing module, located on one side of the display panel and comprising:

a sensing array, having a plurality of light passing regions and a light receiving surface facing away from an object;

a first shielding layer, located between the sensing array and the object and having a plurality of first openings;

a second shielding layer, having a plurality of second openings, wherein the second shielding layer and the first shielding layer are respectively located on two opposite sides of the sensing array; and a reflective layer, wherein the reflective layer and the sensing array are respectively located on two opposite sides of the second shielding layer, the first openings allow a plurality of light beams reflected by the object to pass through, the light passing regions allow the light beams passing through the first openings to pass through, the second openings allow the light beams passing through the light passing regions to pass through and to be transmitted to the reflective layer, the reflective layer reflects the light beams so that the light beams pass through the second openings again to be transmitted to the light receiving surface of the sensing array.

11. The image capturing apparatus as recited in claim 10, further comprises:

an adhesive layer, located between the display panel and the first shielding layer.

12. The image capturing apparatus as recited in claim 10, wherein the sensing array includes a plurality of sensing elements, each of the sensing elements includes a light receiving surface and a metal layer, and the light receiving surface of the sensing element is located between the metal layer and the reflective layer.

13. The image capturing apparatus as recited in claim 12, wherein the sensing module further comprises:

a third shielding layer, wherein the third shielding layer is located between the first shielding layer and the metal layer, and the third shielding layer has a plurality of third openings overlapped with the light passing regions.

14. The image capturing apparatus as recited in claim 10, wherein the sensing module further comprises:

a substrate, disposed between the first shielding layer and the sensing array; and an adhesive layer, disposed between the sensing array and the second shielding layer.

15. The image capturing apparatus as recited in claim 14, wherein the sensing module further comprises:

a bandpass filter layer, located between the display panel and the substrate.

16. The image capturing apparatus as recited in claim 14, wherein the sensing module further comprises:

a bandpass filter layer, located between the substrate and the reflective layer.

17. The image capturing apparatus as recited in claim 10, wherein the sensing module further comprises:

a plurality of microlenses, respectively disposed in the first openings.

18. The image capturing apparatus as recited in claim 17, wherein an air gap is located between the mircolenses and the display panel.

19. The image capturing apparatus as recited in claim 17, wherein the first openings, the second openings, and the light passing regions are arranged to misalign with each other.

20. The image capturing apparatus as recited in claim 10, wherein the first openings, the second openings, and the light passing regions are arranged to misalign with each other.

* * * * *